United States Patent

Corbett et al.

[11] Patent Number: 5,945,733
[45] Date of Patent: Aug. 31, 1999

[54] STRUCTURE FOR ATTACHING A SEMICONDUCTOR WAFER SECTION TO A SUPPORT

[75] Inventors: Tim J. Corbett, Boise; Walter L. Moden, Meridian, both of Id.

[73] Assignee: Micron Technology, Inc., Boise, Id.

[*] Notice: This patent is subject to a terminal disclaimer.

[21] Appl. No.: 08/909,294

[22] Filed: Aug. 11, 1997

Related U.S. Application Data

[60] Continuation of application No. 08/699,760, Aug. 20, 1996, Pat. No. 5,656,551, which is a division of application No. 08/337,912, Nov. 14, 1994, Pat. No. 5,548,160.

[51] Int. Cl.⁶ .................. H01L 23/495; H01L 23/16; H01L 23/04
[52] U.S. Cl. .................. 257/676; 257/666; 257/668; 257/683; 257/730
[58] Field of Search .................. 257/668, 676, 257/683, 730; 438/118, 119, 123; 156/291, 292, 320

[56] References Cited

U.S. PATENT DOCUMENTS

| | | | |
|---|---|---|---|
| 4,594,134 | 6/1986 | Hanada et al. | 522/99 |
| 4,953,007 | 8/1990 | Erdos | 257/666 |
| 4,989,068 | 1/1991 | Yasuhara | 257/788 |
| 5,089,439 | 2/1992 | Lippey | 437/121 |
| 5,140,404 | 8/1992 | Fogal et al. | 357/70 |
| 5,177,032 | 1/1993 | Fogal et al. | 437/123 |
| 5,206,536 | 4/1993 | Lim | 257/668 |
| 5,218,229 | 6/1993 | Farnworth | 257/676 |
| 5,256,598 | 10/1993 | Farnworth et al. | 437/123 |
| 5,304,842 | 4/1994 | Farnworth | 257/666 |
| 5,470,656 | 11/1995 | Kennard et al. | 428/370 |
| 5,548,160 | 8/1996 | Corbett et al. | 257/666 |
| 5,656,551 | 8/1997 | Corbett et al. | 156/291 |

*Primary Examiner*—Olik Chaudhuri
*Assistant Examiner*—Alonzo Chambliss

[57] ABSTRACT

A method for attaching a semiconductor wafer section to a lead frame comprises a carrier having an outside surface and an adhesive coating the carrier. Prior to use, the structure can be placed onto spools for easy shipment and storage.

21 Claims, 3 Drawing Sheets

STRUCTURE FOR ATTACHING A SEMICONDUCTOR WAFER SECTION TO A SUPPORT

This is a continuation of application Ser. No. 08/699,760, filed Aug. 20, 1996, issued Aug. 12, 1997 as U.S. Pat. No. 5,656,551, which is a division of application Ser. No. 08/337,912, filed Nov. 14, 1994, issued Aug. 20, 1996 as U.S. Pat. No. 5,548,160.

FIELD OF THE INVENTION

The present invention relates to the field of semiconductor manufacture, and more particularly to a method for attaching a semiconductor die to a support.

BACKGROUND OF THE INVENTION

During the manufacture of a semiconductor device a semiconductor wafer section, such as a single die or a plurality of singularized or unsingularized die, is often attached to a support such as a lead frame. Methods of attaching the wafer section to the lead frame include backside attach and "leads over chip" (LOC). With backside attach a back (noncircuit) side of the wafer section can be attached to a paddle of the lead frame. Various materials are used for attaching the semiconductor die to the lead frame, for example thermosets, thermoplastics, eutectics or other metals, epoxies, tapes, or other workable materials. With LOC attach, leads of the lead frame are attached to a circuit side of the die thereby eliminating the paddle. An advantage of LOC over backside attach is that LOC allows for a larger die size in the same package footprint.

With conventional LOC attach a piece of LOC tape is applied between the circuit side of the wafer section and the lead frame. The LOC tape can comprise an inert carrier with a polymer on either side to mechanically interconnect the lead frame and the wafer section. LOC tape is conventionally purchased by a semiconductor assembly plant from a supplier, and is usually supplied pre-cut and layered with polymer. The ideal size of the tape and amount of polymer, however, is dependent on the size of the wafer section. With a smaller wafer section tape of smaller dimensions is desirable which increases package reliability performance such as temperature cycle performance. Using LOC tape which has an overabundance of polymer can cause the device to fail during a solder reflow step due to absorption of moisture in a failure known as "popcorn crack defect mechanism." In addition, excessive polymer can cause coefficient of thermal expansion (CTE) mismatch between the lead frame, the LOC polymer, the silicon wafer section, and a mold compound which encases the wafer section which can also lead to device failure.

To reduce the size of the LOC tape it must be reprocessed by punching or slitting the tape before it is rolled onto a spool which can be difficult with current manufacturing techniques. Sizing the tape as it is originally produced by the supplier can also be difficult as wafer section size can change depending on the process used to manufacture the wafer section and the type of device which is being produced.

If other materials are used for attaching the die to the lead frame the quantity of adhesive and the final thickness of the adhesive between the die and the lead frame must be carefully controlled. This thickness is conventionally controlled by dispensing a measured quantity of adhesive onto the lead frame or wafer section, then applying a controlled pressure for a timed interval to the die by the die attacher. The thickness of the adhesive between the die and the lead frame (the "bond line") is difficult to control in this manner, and can vary greatly with small variations in the viscosity of the adhesive, application temperature, and amount of applied adhesive. If an excessive amount of adhesive is applied, the adhesive can bleed out from under the die and prevent, for example, bond wires from properly attaching to lead fingers of the lead frame. If a uniform bond line is not achieved, the die will not be coplanar with the lead frame, which is known to have associated problems.

A method and apparatus for attaching a wafer section to the lead frame which reduces the problems described above would be desirable.

SUMMARY OF THE INVENTION

In one embodiment of the invention, a semiconductor device comprises a semiconductor wafer section, a lead frame, a carrier having an outside surface, and an adhesive coating the outside surface of the carrier. The carrier and the adhesive are interposed between the wafer section and the lead frame.

Objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE PREFERRED EMBODIMENT

Figure 1:
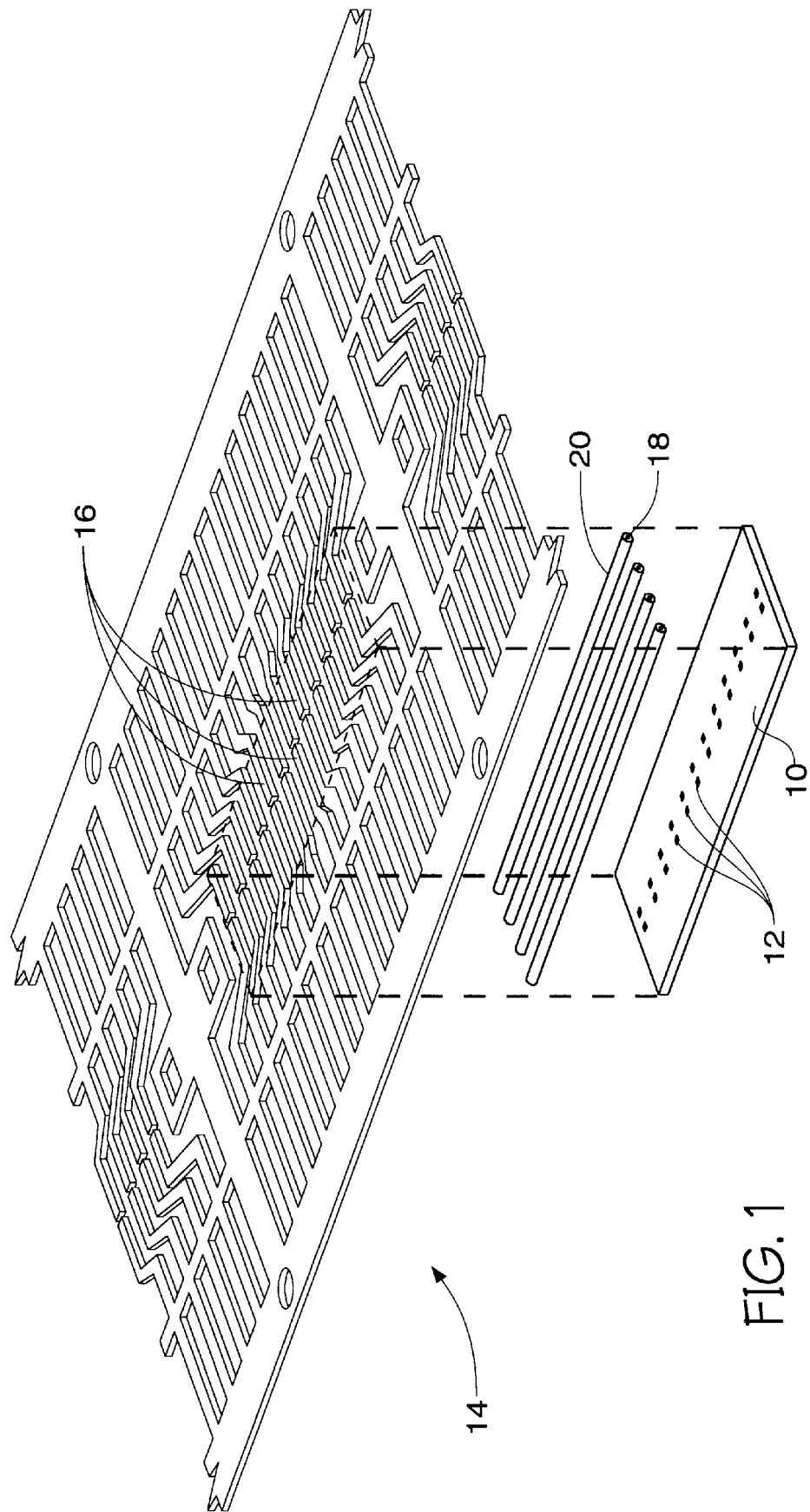
FIG. 1 is an isometric view showing a semiconductor die attached to a lead frame with a carrier having an adhesive coating.
Figure 2:
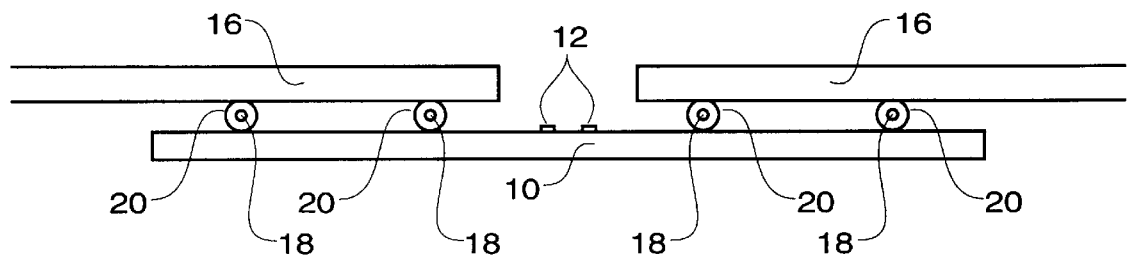
FIG. 2 is a cross section showing a semiconductor die, a lead frame, and a carrier having an adhesive coating, before compression of the adhesive coating.
Figure 3:
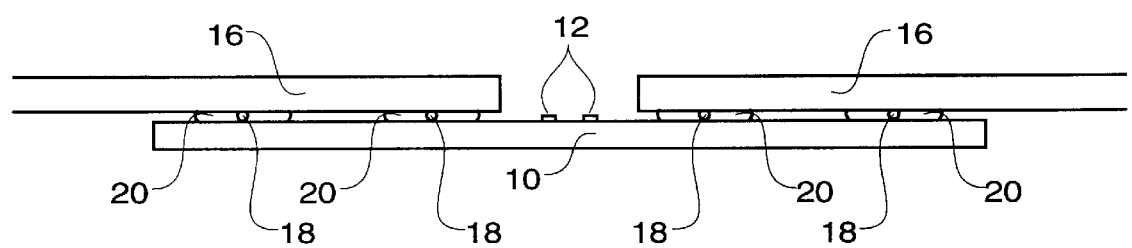
FIG. 3 is a cross section of the FIG. 2 structure after compression of the adhesive coating, and contact of the carrier by the die and lead frame.

One embodiment of the inventive semiconductor device, as shown in FIGS. 1–3, comprises a semiconductor wafer section 10 having bond pads 12, a lead frame 14 having lead fingers 16, a carrier 18 having an outside surface, and a bonding agent (adhesive) 20 coating the outside surface of the carrier 18. The carrier and adhesive are interposed between the wafer section 10 and the lead frame 14 as shown. FIGS. 1–3 demonstrate the use of four strands of the adhesive-coated carrier, but other embodiments are possible and likely. Also, a wafer section with centered bond pads is shown although a wafer section with bond pads along one edge or other configurations are possible and likely.

Numerous materials can be used for the carrier. The carrier should generally be a material which does not soften at temperatures reached by a packaged semiconductor device during use or testing, and which does not decompose or otherwise degrade or contaminate the device. Materials such as various plastics, polyimides, and polymers would function adequately, and a number of other materials are likely to function sufficiently. A metal such as copper alloy may also function to connect the wafer section to a lead frame paddle, but would have to be electrically insulated to prevent shorting of lead fingers on the lead frame when used in a leads-over-chip (LOC) configuration. In an LOC application, the wafer section comprises a circuit side and a back side, and the circuit side of the wafer section is attached to the lead frame with the adhesive-coated carrier.

It should be noted that the thickness of the carrier determines the bond line of the assembled device. The uniformity of the bond line is therefore determined by the uniformity in the thickness of the carrier, and is not dependent on the amount of pressure applied between the die and the lead frame during assembly. A carrier having a diameter of between about 0.05 mils and about 10 mils would be sufficient, although other diameters are possible and likely.

Numerous materials could also function as adhesives. Bonding agents such as various polymers, thermoplastics, and thermnosets would function sufficiently, and epoxies and resins may also function sufficiently. The bonding agent should be a nonconductive material in an LOC application to prevent shorting of the lead fingers.

The carrier material can be manufactured by any workable means, such as by extrusion of the carrier material, to produce a carrier such as a cord having virtually any cross section, for example circular, oval or elliptical, or rectangular. The carrier is then coated with the bonding agent, for example by casting, by drawing the carrier through the bonding agent and drying the bonding agent, or by means known in the art.

If a material such as a thermoset or thermoplastic is used which is hard but pliable at ambient temperatures but softens at elevated temperatures, the adhesive-coated carrier can be wound on spools for easy shipment, storage, and application of the product.

Figure 4:
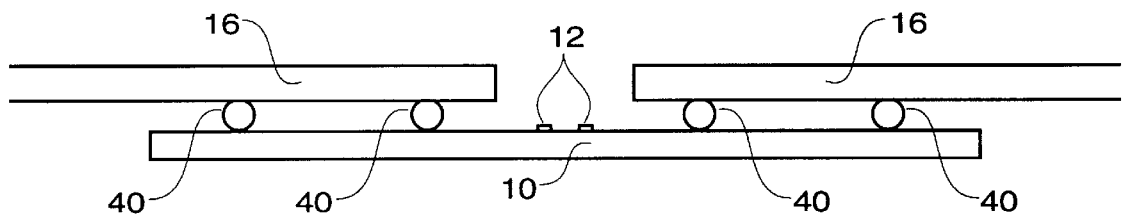
FIG. 4 is a cross section depicting an adhesive string prior to compression.
Figure 5:
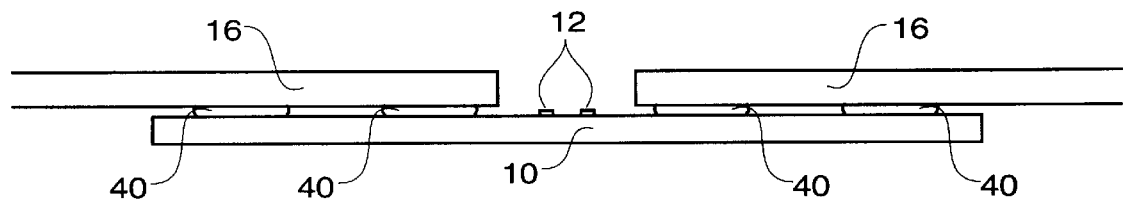
FIG. 5 depicts the string of FIG. 4 after compression.

In another embodiment as depicted in FIGS. 4 and 5, no carrier material is used but an adhesive material is formed, for example by extrusion, to produce a long, thin "string" of adhesive 40. Assembly of the device would be similar as to when a carrier is used, but the carrier would no longer be present to determine the bond line. Formation of a uniform bond line would be determined by the pressure applied between the die and the lead frame during assembly.

In one method to form the semiconductor device, a wafer section and a lead frame are formed according to means known in the art. The adhesive is interposed between the wafer section and the lead frame. At this point, the lead frame 16 and wafer section 10 can be contacting the adhesive as shown in FIG. 2, or the adhesive can be suspended between the wafer section and the lead frame without contacting one or either. In either case, the adhesive layer is heated and the wafer section and lead frame are urged toward each other. The wafer section and the lead frame then contact the adhesive layer, and the adhesive-layer is cooled so that it attaches the wafer section to the lead frame. If a carrier is used, enough pressure should be applied between the wafer section and the lead frame to ensure contact of the carrier by both the wafer section and the lead frame, as shown in FIG. 3, to properly set the bond line.

As an alternative embodiment to the method described above, if an epoxy or resin is used the adhesive can be heated to speed its curing. If an ultraviolet-curable adhesive is used, the method can be altered to cure the adhesive using ultraviolet radiation. Many alternate embodiments to the method described above are possible depending on the materials used as adhesives and carriers, and depending on whether a leads-over-chip device or a device having a die paddle is produced.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A structure for attaching a semiconductor wafer section to a wafer section support comprising:
   an adhesive string comprising a carrier having a diameter and a length substantially greater than said diameter and further comprising an adhesive layer,
   wherein in a cross section generally perpendicular with said length, said carrier has a generally circular cross section.

2. The structure of claim 1 wherein said adhesive layer consists essentially of a material selected from the group consisting of polymer, thermoplastic, and thermoset.

3. The structure of claim 1 wherein said adhesive layer is curable using heat.

4. The structure of claim 1 wherein said adhesive layer is curable using ultraviolet radiation.

5. The structure of claim 1 wherein said carrier is oval or elliptical in cross section.

6. An in-process semiconductor device comprising:
   a semiconductor wafer section;
   a wafer section support;
   an adhesive string comprising an adhesive material and a carrier material, wherein said carrier material has a diameter and a length substantially greater than said diameter, wherein in a cross section generally perpendicular with said length said carrier has a generally circular cross section.

7. The semiconductor device of claim 6 wherein said adhesive string contacts a circuit side of said wafer section.

8. The semiconductor device of claim 7 wherein said wafer section support is a lead frame and said semiconductor device is a leads-over-chip device.

9. The semiconductor device of claim 6 wherein said wafer section support is a lead frame comprising a paddle and said adhesive string contacts said paddle and a noncircuit side of said wafer section.

10. The semiconductor device of claim 6 wherein said adhesive material is oval or elliptical in cross section.

11. The semiconductor device of claim 6 wherein said adhesive string mechanically attaches said wafer section to said support.

12. The device of claim 11 wherein said carrier has a length and a diameter wherein said length is substantially greater than said diameter.

13. An electronic device having at least one semiconductor device, said semiconductor device comprising:
   a semiconductor wafer section;
   a wafer section support;
   an adhesive structure comprising a carrier having a generally circular cross section interposed between said semiconductor wafer section and said wafer section support, said adhesive structure further comprising an adhesive layer laterally spaced from said carrier wherein said adhesive layer contacts said wafer section and said wafer section support.

14. An in-process electronic device comprising at least one in-process semiconductor component, said in-process semiconductor component comprising:

a semiconductor wafer section;

a wafer section support;

an adhesive structure comprising a carrier and an adhesive layer contacting said carrier, wherein said carrier has a diameter and a length substantially greater than said diameter and, in a cross section generally perpendicular with said length, said carrier has a generally circular shape.

15. The electronic device of claim 14 wherein said adhesive layer is laterally spaced from at least first and second sides of said carrier.

16. The electronic device of claim 14 further comprising said adhesive layer being laterally spaced on at least two sides of said carrier and contacting both said wafer section and said support.

17. A semiconductor device comprising:

a semiconductor wafer section;

a semiconductor wafer section support;

a carrier having a thickness interposed between said wafer section and said wafer section support, wherein a spacing between said wafer section and said support is set by said thickness of said carrier; and an adhesive layer extending laterally from said carrier and contacting both said wafer section and said wafer section support.

18. The semiconductor device of claim 17 wherein said carrier has a diameter and a length substantially greater than said diameter, wherein said carrier, in a cross section generally perpendicular with said length, has a generally circular cross section.

19. The semiconductor device of claim 17 wherein said adhesive extends laterally at least two directions from said carrier.

20. The semiconductor device of claim 17 further comprising a plurality of carriers in spaced relation across said wafer section, each said carrier having a said thickness wherein said adhesive layer extends laterally between at least two of said plurality of carriers.

21. The semiconductor device of claim 20 wherein said plurality of carriers each has a diameter and a length substantially greater than said diameter, wherein in a cross section generally perpendicular with each said length each said carrier has a generally circular cross section.

* * * * *